United States Patent
Xiao et al.

(10) Patent No.: US 9,834,861 B2
(45) Date of Patent: Dec. 5, 2017

(54) METHOD FOR GROWING MONOCRYSTALLINE SILICON AND MONOCRYSTALLINE SILICON INGOT PREPARED THEREOF

(71) Applicant: ZING SEMICONDUCTOR CORPORATION, Shanghai (CN)

(72) Inventors: Deyuan Xiao, Shanghai (CN); Richard R. Chang, Shanghai (CN)

(73) Assignee: ZING SEMICONDUCTOR CORPORATION, Shanghai (CN)

( * ) Notice: Subject to any disclaimer, the term of this patent is extended or adjusted under 35 U.S.C. 154(b) by 36 days.

(21) Appl. No.: 15/198,893

(22) Filed: Jun. 30, 2016

(65) Prior Publication Data
US 2017/0253993 A1 Sep. 7, 2017

(30) Foreign Application Priority Data
Mar. 3, 2016 (CN) .......................... 2016 1 0120879

(51) Int. Cl.
C30B 29/06 (2006.01)
C30B 15/00 (2006.01)
C30B 15/20 (2006.01)
C30B 30/04 (2006.01)

(52) U.S. Cl.
CPC ............ C30B 29/06 (2013.01); C30B 15/002 (2013.01); C30B 15/203 (2013.01); C30B 30/04 (2013.01)

(58) Field of Classification Search
CPC .......... C30B 15/02; C30B 15/00; C30B 29/06
See application file for complete search history.

(56) References Cited

U.S. PATENT DOCUMENTS 5,872,387 A 2/1999 Lyding et al.
2009/0087632 A1 4/2009 Schulze et al.

FOREIGN PATENT DOCUMENTS

JP 5321460 B2 10/2013
TW 200836356 A 9/2008

OTHER PUBLICATIONS

Newman et al "Dipole moments of H2, D2 and HD molecules iin Czochralski silicon", Physical Review B vol. 60, No. 18 Nov. 1, 1999, pp. 12775-12780.*
Mchedlidze et al "Incorporation of oxygen or di-hydrogen in silicon monovacancy: spin-resonance study of defect wxcited state" hydica B: Condensed Matter vol. 308-310 Dec. 2001 pp. 321-324.*
Lyding et al. Reduction of Hot Electron Degradation in Metal Oxide Semiconducgtor Transistors by Deuterium Processing. *American Institute of Physics*. Letter 68. Apr. 29, 1996. pp. 1-4.

* cited by examiner

Primary Examiner — Robert M Kunemund
(74) Attorney, Agent, or Firm — Huffman Law Group, PC

(57) ABSTRACT

This invention provides a method for growing monocrystalline silicon by applying Czochralski method comprising forming a melt of silicon-containing materials in a crucible and pulling the melt for monocrystalline silicon growth, which is characterized by, the silicon-containing materials comprising a deuterium-implanted nitride-deposited silicon and a monocrystalline silicon, introducing a gas containing argon during formation of the melt, and, applying a magnetic field during the pulling step. This invention also provides a method for producing a wafer based on the above monocrystalline silicon.

10 Claims, 1 Drawing Sheet

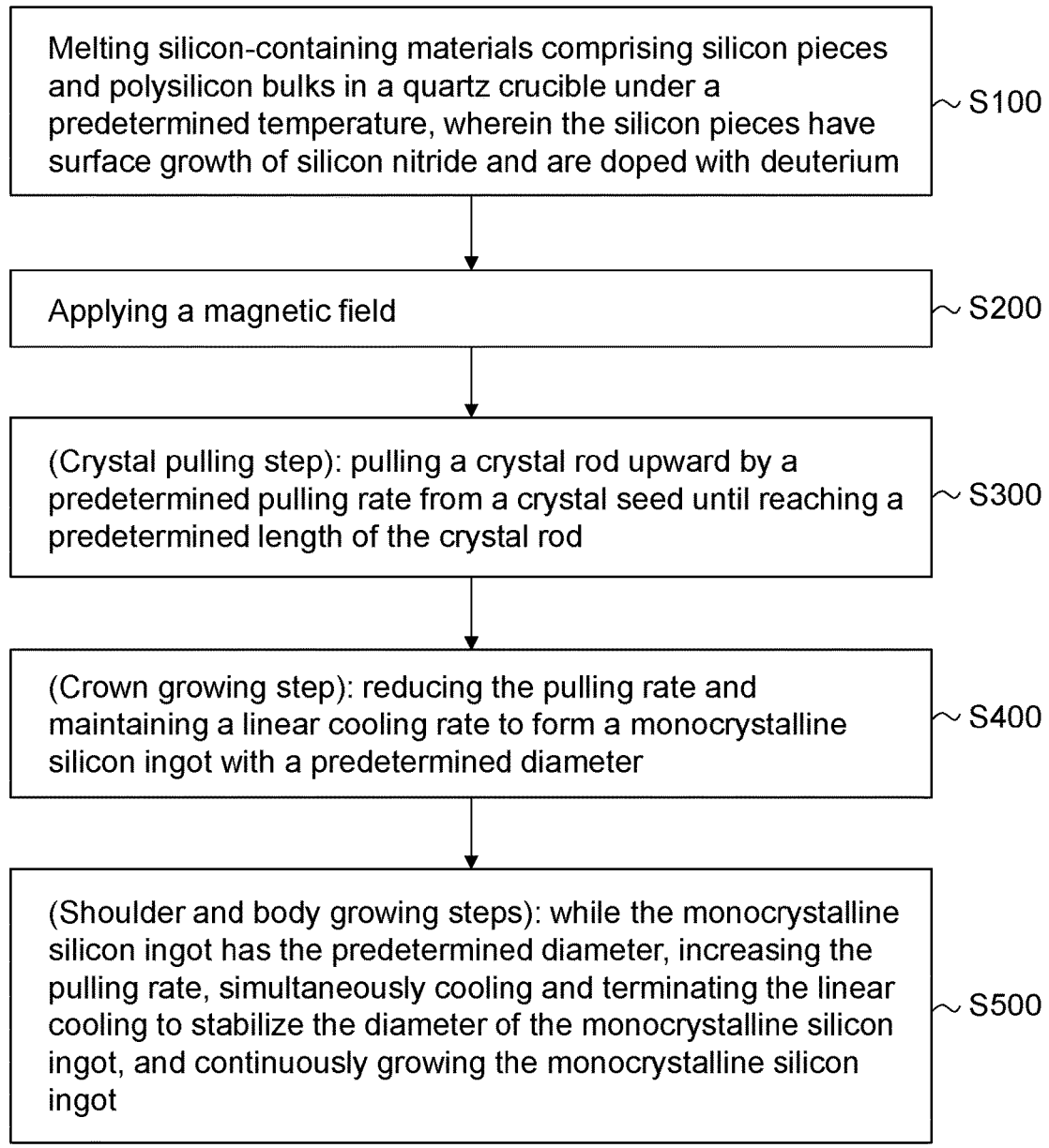

METHOD FOR GROWING MONOCRYSTALLINE SILICON AND MONOCRYSTALLINE SILICON INGOT PREPARED THEREOF

BACKGROUND OF THE INVENTION

1. Field of the Invention

The present application relates to a method for growing silicon crystal, and more particularly to a method for growing monocrystalline silicon.

2. Description of the Related Art

In Czochralski method (CZ method) for growing monocrystalline silicon, oxygen may enter monocrystalline silicon because of the melt of quartz crucible. The oxygen mainly exists in silicon lattice space and precipitates when the concentration exceeds beyond its solubility in silicon, the oxygen precipitation defect is formed thereby. The oxygen precipitation defect may damage the integrated circuit device.

Intrinsic gettering technology means that a clean zone with a certain depth having no defects can be formed on the surface of silicon wafer by generating high-density oxygen precipitation within the silicon wafer. The clean zone can be used for device manufacture. However, smaller character size is requested with development of ultra-large-scale integrated circuit (ULSI), so that the oxygen concentration in the monocrystalline silicon has to be reduced to prevent defect formation in the source area. Recently, since thermal budget of integrated circuit manufacture process is significantly reduced, it cannot provide suitable conditions for oxygen precipitation within the silicon wafer and the intrinsic gettering effect is adversely affected.

The above problems can be solved by nitrogen doping during growth of monocrystalline silicon in Czochralski method. Nitrogen is able to facilitate oxygen precipitation within monocrystalline silicon, therefore the intrinsic gettering effect can be enhanced. Further, nitrogen doping is able to increase mechanical strength of the silicon wafer and reduce void defect. Distribution of oxygen precipitation is studied by infrared light scattering tomography (IR-LST) and scanning infrared microscopy (SIRM). It shows that, after one-step thermal annealing of a nitrogen doped 300 mm silicon wafer with suitable nitrogen doping concentration, a high-density oxygen precipitation can be generated and a clean zone with a certain depth can be formed near the surface of the wafer. Further, with the increasing nitrogen concentration, the radial distribution of oxygen precipitation becomes more homogeneous.

In this industry, it is general to apply solid-phase nitrogen doping, e.g. powder of silicon nitride ($Si_3N_4$), to dope nitrogen into monocrystalline silicon. The solid-phase nitrogen doping is able to control the nitrogen concentration, but it is difficult to obtain $Si_3N_4$ powder with high purity. $Si_3N_4$ particle often remains because of its difficult melting property. Therefore, dislocation free monocrystalline silicon cannot be formed. Gas-phase nitrogen doping is also applied in this industry, in which high purity nitrogen gas or nitrogen/argon mixture gas is introduced after seeding. The nitrogen doping concentration in the silicon crystal is controlled by the time period of nitrogen introduction. The gas-phase nitrogen doping is achieved by the reaction of the nitrogen gas and the silicon melt, so that the purity is relatively high and the silicon nitride particle is not easily formed. However, it is difficult to control the process and the nitrogen concentration since the reaction of gas-phase nitrogen doping is totally based on thermal convection. According to the above, a method for manufacturing monocrystalline silicon is still required.

Hydrogen passivation has become a well-known and established practice in the fabrication of semiconductor devices. In the hydrogen passivation process, defects, which affect the operation of semiconductor devices, are removed. For example, such defects have been described as recombination/generation centers on active components of semiconductor devices. These centers are thought to be caused by dangling bonds which introduce states in the energy gap which remove charged carriers or add unwanted charge carriers in the device, depending in part on the applied bias. While dangling bonds occur primarily at surfaces or interfaces in the device, they also are thought to occur at vacancies, micropores, dislocations, and also to be associated with impurities.

Another problem, which has arisen in the semiconductor industry, is the degradation of device performance by hot carrier effects. This is particularly of concern with respect to smaller devices in which proportionally larger voltages are used. When such high voltages are used, channel carriers can be sufficiently energetic to enter an insulating layer and degrade device behavior.

SUMMARY

The present application provides a method for growing monocrystalline silicon by applying Czochralski method comprising forming a melt of silicon-containing materials in a crucible and pulling the melt for monocrystalline silicon growth, which is characterized by, using the silicon-containing materials comprising silicon pieces and polysilicon bulks, wherein the silicon pieces have surface growth of silicon nitride and are doped with deuterium; introducing a gas containing argon during formation of the melt; and, applying a magnetic field during the pulling step.

The present application provides a method for producing a wafer comprising applying a monocrystalline silicon ingot prepared by the above method, which is characterized by that, the wafer comprises $1\times10^{13}$ to $1\times10^{16}$ nitrogen atoms/cubic centimeter (cm3).

BRIEF DESCRIPTION OF THE DRAWINGS

FIG. 1 illustrates the process for growing monocrystalline silicon of the present application.

DETAILED DESCRIPTION OF THE EMBODIMENTS

Although the following with reference to the accompanying drawings of the method of the present invention is further described in more detail, there is shown a preferred embodiment of the present invention. A person having ordinary skills in the art may modify the invention described herein while still achieving the advantageous effects of the present invention. Thus, these embodiments should be understood as broad teaching one skilled in the art, and not as a limitation of the present invention.

For purpose of clarity, not all features of an actual embodiment are described. It may not describe the well-known functions as well as structures in detail to avoid confusion caused by unnecessary details. It should be considered that, in the developments of any actual embodiment, a large number of practice details must be made to achieve the specific goals of the developer, for example, according to the requirements or the constraints of the system or the commercials, one embodiment is changed to another. In addition, it should be considered that such a development effort might be complex and time-consuming, but for a person having ordinary skills in the art is merely routine work.

In the following paragraphs, the accompanying drawings are referred to describe the present invention more specifically by way of example The advantages and the features of the present invention are more apparent according to the following description and claims. It should be noted that the drawings are in a simplified form with non-precise ratio for the purpose of assistance to conveniently and clearly explain an embodiment of the present invention.

In the present application, the method for growing monocrystalline silicon is based on Czochralski method (CZ). The monocrystalline silicon is prepared by solid-phase nitrogen doping and magnetic field-Czochralski method (MCZ). Briefly, in Czochralski method, the silicon-containing materials placed in a crucible melts to form a melt, and the melt is pulled to grow as a monocrystalline silicon. The method of the present application is characterized by, using the silicon-containing materials comprising silicon pieces and polysilicon bulks, wherein the silicon pieces have surface growth of silicon nitride and are doped with deuterium; introducing a gas containing argon during formation of the melt; and, applying a magnetic field during the pulling step.

In the present application, the silicon-containing materials comprise silicon pieces and polysilicon bulks, wherein the silicon pieces have surface growth of silicon nitride and are doped with deuterium. In one embodiment, the silicon nitride is grown by chemical vapor deposition or plasma chemical vapor deposition. In one embodiment, the silicon nitride has a thickness of 20-5000 nm.

After growing silicon nitride, the silicon pieces are doped with deuterium by ion implantation. In one embodiment, it applies an implantation energy of 1 keV to 800 keV and an implantation dose of $1\times10^{12}$ to $1\times10^{18}$ ions/cm$^2$ for the ion implantation.

In the present application, the magnetic field has an intensity of 1000 to 5000 Gauss.

In embodiments, the magnetic field is a superconducting gradient magnetic field. In one embodiment, the magnetic field comprises a magnetic line angled at 0-45° or 45-90° to the melt surface, the angle can be adjusted according to practical requirements. In one preferred embodiment, the magnetic line angled at 0-10° or 80-90° to the melt surface.

The method of the present application comprises the following detailed steps. The silicon-containing materials containing silicon pieces and polysilicon bulks in the crucible melt under a predetermined temperature, wherein the silicon pieces have surface growth of silicon nitride and are doped with deuterium. The magnetic field is applied. The crystal rod is pulled upward by a predetermined pulling rate from a crystal seed until reaching a predetermined length of the crystal rod. The pulling rate is reduced, and the linear cooling rate is maintained to form the monocrystalline silicon ingot with a predetermined diameter. While the monocrystalline silicon ingot has the predetermined diameter, the pulling rate is immediately increased, and the temperature is simultaneously cooled down. Simultaneously, the linear cooling step is terminated. The rising rate of the crucible is controlled. According to the change rate of the diameter of the monocrystalline silicon ingot, the pulling rate is slowly adjusted to stabilize the diameter of the monocrystalline silicon ingot, and continuously grow the monocrystalline silicon ingot. Automatic diameter-controlling program is applied to monitor the ingot growth.

In embodiments, the diameter of the monocrystalline silicon ingot is controlled by the pulling rate and the predetermined temperature.

In embodiments, the silicon-containing materials contain silicon pieces and polysilicon bulks, wherein the silicon pieces have a thin film of silicon nitride and are doped with deuterium. The materials are well mixed and melt under the temperature exceeding the melting point of silicon nitride, i.e., higher than 1900° C. Then the melt is cooled and seeded by the crystal seed. At this time point, the central area of the melt surface is at the temperature of silicon melting point. Then the solid-phase nitrogen doping step and the crystal pulling growth can be performed. Accordingly, nitrogen-doping concentration in monocrystalline silicon can be precisely controlled, and homogeneous doping can be achieved.

The present application provides a method for producing a wafer comprising applying a monocrystalline silicon ingot prepared by the above method, which is characterized by that, the wafer comprises $1\times10^{13}$ to $1\times10^{16}$ nitrogen atoms/cm3.

In embodiments, the wafer comprises $1\times10^{12}$ to $1\times10^{18}$ deuterium atoms/cm3.

In embodiments, the monocrystalline silicon ingot is treated with cutting, surface grinding, polishing, edge finishing and washing to form the wafer.

EXAMPLES

In the present application, solid-phase nitrogen doping as well as magnetic field Czochralski method (MCZ) is applied to the nitrogen doping of monocrystalline silicon. The process generally comprises the following steps: melting, seeding, crystal pulling, crown growing, shoulder growing, and body growing. FIG. 1 illustrates one embodiment of the method for growing monocrystalline silicon of the present application, which comprises:

S100: melting silicon-containing materials comprising silicon pieces and polysilicon bulks in a quartz crucible under a predetermined temperature, wherein the silicon pieces have surface growth of silicon nitride and are doped with deuterium;

S200: applying a magnetic field;

S300 (crystal pulling step): pulling a crystal rod upward by a predetermined pulling rate from a crystal seed until reaching a predetermined length of the crystal rod;

S400 (crown growing step): reducing the pulling rate and maintaining a linear cooling rate to form a monocrystalline silicon ingot with a predetermined diameter; and S500 (shoulder and body growing steps): while the monocrystalline silicon ingot has the predetermined diameter, increasing the pulling rate, simultaneously cooling and terminating the linear cooling to stabilize the diameter of the monocrystalline silicon ingot, and continuously growing the monocrystalline silicon ingot.

In the solid-phase nitrogen-doping step, an electronic-grade film of silicon nitride is prepared by using silicon pieces containing silicon nitride grown on the surface as the silicon materials. Said silicon nitride film can be obtained by vapor deposition, for example, chemical vapor deposition (CVD) under relative high temperature or plasma enhanced chemical vapor deposition (PECVD) under relative low temperature and low pressure, on silicon substrate. The reactions are shown as follows.

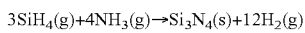

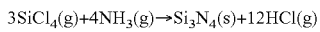

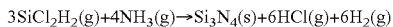

In the above reactions, g represents gas, and s represent solid.

A silicon nitride layer with a thickness of 20-5000 nm can be formed by CVD or PECVD on the silicon substrate.

Then the deuterium ion implantation is applied to the silicon substrate having silicon nitride layer. The implantation energy is 1 keV to 800 keV and the implantation dose is $1 \times 10^{12}$ to $1 \times 10^{18}$ ions/cm$^2$.

The above silicon-containing materials are placed in a quartz crucible, fully mixed and melt at 1900-2000° C. (i.e. higher than the melting point of silicon nitride) under introduction of argon. Then the obtained melt is cooled to make the temperature of the central area of the melt surface be about 1400° C. (i.e. the melting point of silicon).

A magnetic field is applied to the crucible and the melt, preferably, the magnetic field is a superconducting gradient magnetic field. The magnetic field comprises a magnetic line angled at 0-45° or 45-90° to the melt surface, preferably, the angle is 0-10° or 80-90. The magnetic field has an intensity of 1000 to 5000 Gauss.

The crystal seed is seeded, then the predetermined crystal pulling rate is applied to pull the crystal rod upward. Until reaching the predetermined length of the crystal rod, the pulling rate is reduced to enter the crown growing step. In the crown growing step, the reduced pulling rate and the stable linear cooling rate are applied to form the monocrystalline silicon ingot with the predetermined diameter, and then enter the shoulder and body growing steps. While the monocrystalline silicon ingot satisfies the requirements, the pulling rate is rapidly increased, the temperature is rapidly cooled, the linear cooling is simultaneously terminated, and a raising rate is provided to the crucible. The pulling rate is gently adjusted according to the diameter change of the monocrystalline silicon ingot. While the diameter of the monocrystalline silicon ingot is relative stable, the automatic diameter-controlling program is applied to monitor the following procedures.

According to the above method, the nitrogen doping concentration in monocrystalline silicon can be controlled more precisely, and the homogeneous nitrogen doping can be achieved. The monocrystalline silicon ingot or the wafer prepared by the method of the present application comprises $1 \times 10^{13}$ to $1 \times 10^{16}$ nitrogen atoms/cm$^3$ and $1 \times 10^{12}$ to $1 \times 10^{18}$ deuterium atoms/cm$^3$.

Rapid thermal annealing (RTA) treatment is applied to the obtained nitrogen doped monocrystalline silicon wafer to remove the crystal originated particle (COP) defects existing within 0.5 μm of depth from the sheet surface. The surface COP density can be reduced to about 50% or lower. The obtained silicon wafer has none of bulk micro defect (BMD) on the surface.

Addition of deuterium atom in the silicon melt is able to store the deuterium atom in space or gap within the monocrystalline silicon ingot, and reduce the concentration of oxygen and carbon impurities. During formation of a device on a wafer made of the monocrystalline silicon ingot, the deuterium atoms are out-diffusion into the interface between the gate dielectric layer and semiconductor and covalently bound to the dangling bonds to form the more stable structures. Accordingly, hot carrier effects can be prevented, leakage currents can be reduced, and the properties of the device can be enhanced.

Realizations of the above method have been described in the context of particular embodiments. These embodiments are meant to be illustrative and not limiting. Many variations, modifications, additions, and improvements are possible. These and other variations, modifications, additions, and improvements may fall within the scope of the invention as defined in the claims that follow.

What is claimed is:

1. A method for growing monocrystalline silicon by applying Czochralski method comprising forming a melt of silicon-containing materials in a crucible and pulling the melt for monocrystalline silicon growth, which is characterized by, using the silicon-containing materials comprising silicon pieces and polysilicon bulks, wherein the silicon pieces have surface growth of silicon nitride and are doped with deuterium;
   introducing a gas containing argon during formation of the melt; and
   applying a magnetic field during the pulling step.

2. The method of claim 1, wherein the silicon nitride is grown by low pressure chemical vapor deposition or plasma chemical vapor deposition.

3. The method of claim 2, wherein the silicon nitride has a thickness of 20-5000 nm.

4. The method of claim 1, wherein the silicon pieces are doped with deuterium by ion implantation after growth of silicon nitride.

5. The method of claim 4, wherein ion implantation has an implantation energy of 1 keV to 800 keV and an implantation dose of $1 \times 10^{12}$ to $1 \times 10^{18}$ ions/cm$^2$.

6. The method of claim 1, which comprises the following steps:
   melting the silicon-containing materials comprising silicon pieces and polysilicon bulks in the crucible under a predetermined temperature, wherein the silicon pieces have surface growth of silicon nitride and are doped with deuterium;
   applying a magnetic field; pulling a crystal rod upward by a predetermined pulling rate from a crystal seed until reaching a predetermined length of the crystal rod;
   reducing the pulling rate and maintaining a linear cooling rate to form a monocrystalline silicon ingot with a predetermined diameter; and
   while the monocrystalline silicon ingot has the predetermined diameter, increasing the pulling rate, simultaneously cooling and terminating the linear cooling to stabilize the diameter of the monocrystalline silicon ingot, and continuously growing the monocrystalline silicon ingot.

7. The method of claim 1, wherein the magnetic field has an intensity of 1000 to 5000 Gauss.

8. A method for producing a wafer comprising applying a monocrystalline silicon ingot prepared by the method of claim 1, which is characterized by that, the wafer comprises $1 \times 10^{13}$ to $1 \times 10^{16}$ nitrogen atoms/cm$^3$.

9. The method of claim 1, wherein the wafer comprises $1 \times 10^{12}$ to $1 \times 10^{18}$ deuterium atoms/cm$^3$.

10. The method of claim 9, wherein the monocrystalline silicon ingot is treated with cutting, surface grinding, polishing, edge finishing and washing to form the wafer.

* * * * *